United States Patent
Matsudai et al.

(10) Patent No.: US 6,683,343 B2
(45) Date of Patent: Jan. 27, 2004

(54) HIGH VOLTAGE SEMICONDUCTOR DEVICE HAVING TWO BUFFER LAYER

(75) Inventors: Tomoko Matsudai, Tokyo (JP); Akio Nakagawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 10/084,051

(22) Filed: Feb. 28, 2002

(65) Prior Publication Data

US 2002/0117712 A1 Aug. 29, 2002

(30) Foreign Application Priority Data

Feb. 28, 2001 (JP) ........................... 2001-054945

(51) Int. Cl.[7] ............... H01L 29/76; H01L 29/94; H01L 31/062; H01L 31/113; H01L 31/119

(52) U.S. Cl. ............... 257/328; 257/329; 257/330; 257/327

(58) Field of Search ................... 257/327–334

(56) References Cited

U.S. PATENT DOCUMENTS

| | | | |
|---|---|---|---|
| 5,466,951 A | | 11/1995 | Brunner et al. |
| 5,506,153 A | | 4/1996 | Brunner et al. |
| 5,679,966 A | * | 10/1997 | Baliga et al. ............ 257/139 |
| 5,751,024 A | * | 5/1998 | Takahashi ............... 257/139 |
| 5,910,668 A | * | 6/1999 | Disney .................... 257/329 |
| 5,923,066 A | * | 7/1999 | Tihanyi .................... 257/331 |
| 6,091,107 A | * | 7/2000 | Amaratunga et al. .... 257/331 |
| 6,137,136 A | * | 10/2000 | Yahata et al. ............. 257/331 |
| 6,211,549 B1 | * | 4/2001 | Funaki et al. ............ 257/329 |
| 6,246,092 B1 | * | 6/2001 | Fujihira et al. ........... 257/341 |
| 6,262,470 B1 | * | 7/2001 | Lee et al. ................. 257/565 |
| 6,524,894 B1 | * | 2/2003 | Nozaki et al. ............ 438/138 |
| 6,525,373 B1 | * | 2/2003 | Kim ......................... 257/330 |

FOREIGN PATENT DOCUMENTS

| | | |
|---|---|---|
| JP | 6-268226 | 9/1994 |
| JP | 10-189956 | 7/1998 |
| JP | 11-274484 | 10/1999 |
| JP | 2000-260778 | 9/2000 |

OTHER PUBLICATIONS

Tomoko Matsudai, et al., "Advanced 60μm Thin 600V Punch–Through IGBT Concept for Extremely Low Forward Voltage and Low Turn–off Loss", Proceedings of 2001 International Symposium on Power Semiconductor Devices & ICs, Osaka, pp. 441–444.

T. Laska, et al., "The Field Stop IGBT(FS IGBT)–A New Power Device Concept with a Great Improvement Potential", ISPSD, 2000, Catalog No.: 00CH37094C, pp. 355–358.

Tomoko Matsudai, et al., "New 600 V Trench Gate Punch–Through IGBT Concept with Very Thin Wafer and Low Efficiency p–emitter, Having an On–state Voltage Drop Lower Than Diodes", IPEC, Tokyo, 2000, pp. 292–296.

* cited by examiner

Primary Examiner—B. William Baumeister
Assistant Examiner—Jesse A. Fenty
(74) Attorney, Agent, or Firm—Oblon, Spivak, McClelland, Maier & Neustadt, P.C.

(57) ABSTRACT

In an IGBT, an n buffer layer is formed under an n⁻ high resistance layer in which a MOS gate structure is formed. An n⁺ buffer layer is formed between the n buffer layer and a p⁺ drain layer. Since the p⁺ drain layer is doped at a low dose, the efficiency of carrier injection can be reduced and a high-speed operation is possible without lifetime control. Since no lifetime control is performed, the on-state voltage can be low. Since the n buffer layer does not immediately stop the extension of the depletion layer during a turn-off period, oscillation of the current and voltage is prevented. The n⁺ buffer layer maintains a sufficient withstand voltage when a reverse bias is applied.

10 Claims, 14 Drawing Sheets

Phosphorus

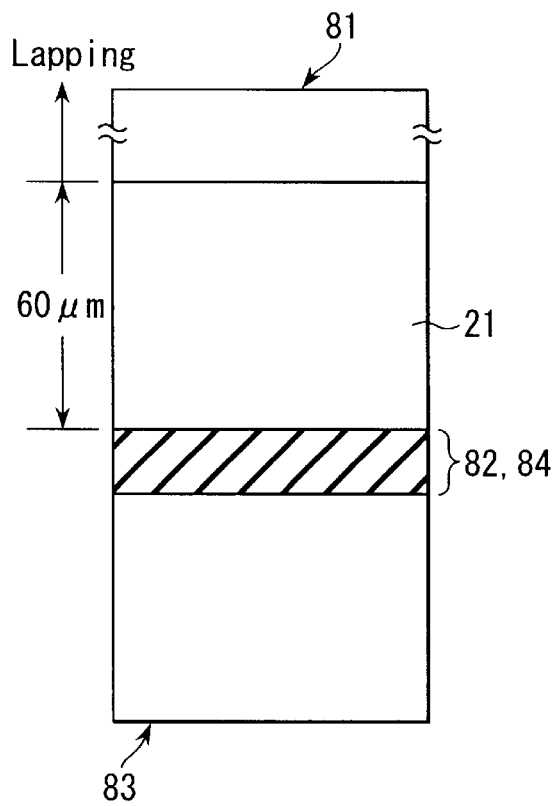
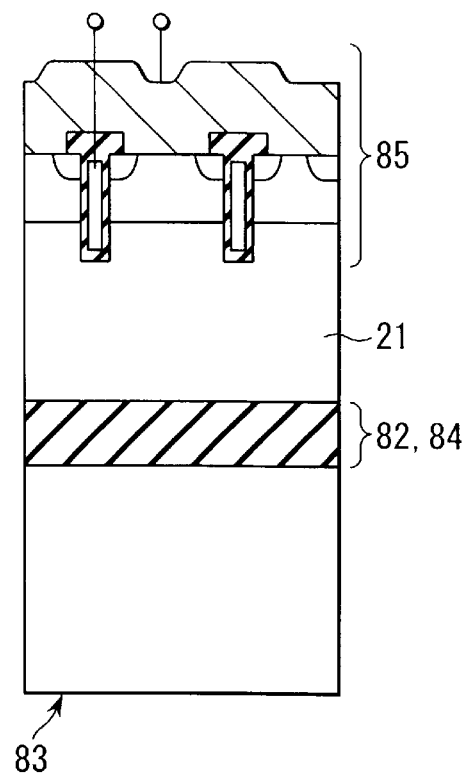
FIG. 11A  FIG. 11B
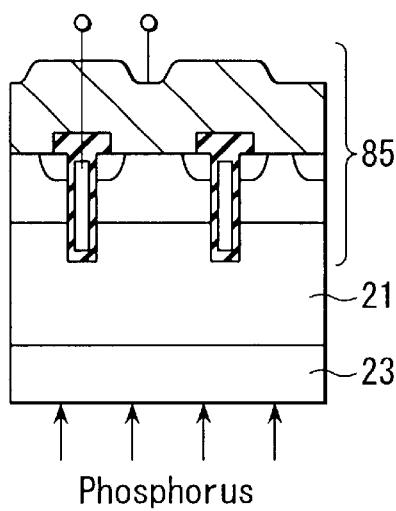
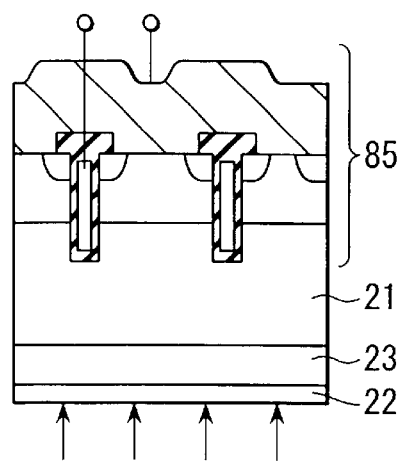
FIG. 11C  FIG. 11D

HIGH VOLTAGE SEMICONDUCTOR DEVICE HAVING TWO BUFFER LAYER

CROSS-REFERENCE TO RELATED APPLICATIONS

This application is based upon and claims the benefit of priority from the prior Japanese Patent Application No. 2001-054945, filed Feb. 28, 2001, the entire contents of which are incorporated herein by reference.

BACKGROUND OF THE INVENTION

1. Field of the Invention

The present invention relates to a semiconductor device which withstands a high voltage, for example, an IGBT (Insulating Gate Bipolar Transistor).

2. Description of the Related Art

FIG. 18A shows a conventional vertical IGBT of a punch-through type. In the IGBT 10, an $n^+$-type buffer layer (hereinafter referred to as the $n^+$ buffer layer) 12 and an $n^-$-type high resistance layer (hereinafter referred to as the $n^-$ high resistance layer) 13 are formed by epitaxial growth on a $p^+$ substrate 11. A p-type base layer 14 is formed in a surface region of the $n^-$ high resistance layer 13. An $n^+$ source region (cathode) 15 is formed in a surface region of the base layer 14. A trench-type gate electrode 16 is formed in the source region 15, the base layer 14 and the $n^-$ high resistance layer 13. The gate electrode 16 is insulated from the source region 15, the base layer 14 and the $n^-$ high resistance layer 13 by a gate insulating film 17.

The IGBT 10 is produced with, for example, an epitaxial substrate, on which an epitaxial layer is formed in advance. However, the epitaxial substrate is disadvantageous in that the cost for manufacturing an element is high since the wafer is expensive.

Further, in the aforementioned IGBT 10, the substrate 11, which is relatively thick, is used as a $p^+$ drain layer (anode). Therefore, to lower the carrier injection efficiency, it is necessary to control the lifetime. Typically, a process for shortening the lifetime of 5–10 $\mu$s to about 100 ns is performed. As a result, a high-speed turn-off characteristic can be obtained, although the process has a drawback that the on-state voltage rises. This is because the carrier density in the $n^-$ high resistance layer 13 is lowered by shortening the lifetime.

On the other hand, the on-state voltage can be lower if the lifetime is not shortened. However, in this case, the turn-off time will be considerably long. Thus, there is a tradeoff relationship between the on-state voltage and the turn-off time.

Further, a depletion layer extends from the base layer 14 due to a voltage applied to the element when the current is turned off. When the depletion layer reaches the $n^+$ buffer layer 12, it is immediately stopped. For this reason, the drain current is instantaneously dropped to zero, so that the drain voltage oscillates, resulting in generation of noise.

FIG. 18B shows another conventional IGBT, in which the characteristic of the element described above is improved. The IGBT 20 shown in FIG. 18B has a $p^+$ anode structure injected with a small amount of impurities at a low dose, which is adopted in a non-punch-through IGBT. Therefore, the operation speed can be increased without controlling the lifetime. The IGBT 20 comprises an n-type buffer layer (hereinafter referred to as the n buffer layer) 23 formed between the $n^-$ high resistance layer 21 and the $p^+$ drain layer (anode) 22. The n buffer layer 23 maintains the static breakdown voltage.

In this structure, the drain layer 22 must be injected with impurities at a low dose but have such a high concentration in the surface portion thereof that can establish ohmic contact. Therefore, the region where the impurities injected to form the drain layer 22 are diffused must be limited to a very shallow depth. The total thickness of the IGBT is equal to the thickness of the $n^-$ high resistance layer 21, which is determined in accordance with the static breakdown voltage, plus the thickness of the n buffer layer 23 and the $p^+$ drain layer 22. More specifically, in the case of an element of the 600V voltage series, the total thickness is as small as about 60 $\mu$m.

Thus, the element is very thin. Therefore, for example, when the element is lapped, if the thickness is thinner or thicker than the design value by several microns, the thickness of the buffer layer 23 is varied. The variation in thickness of the buffer layer 23 is reflected on a variation in dose into the buffer layer 23, with the result that the characteristics of the element are considerably influenced. Therefore, when the element is manufactured, it is necessary to finish the element to the designed thickness with a minimum error. However, according to the current lapping technique, the lapping error is ±5 to 10 $\mu$m, which is significantly large relative to the overall thickness of 60 $\mu$m.

As described above, in the conventional vertical IGBTs, there is a tradeoff relationship between the on-state voltage and the turn-off time. Therefore, in the IGBT of the punch-through type using a thick $p^+$ substrate as a $p^+$ anode, since lifetime control is inevitable, there is a limit to reduction in ON characteristic. In the IGBT of the non-punch-through type in which the static breakdown voltage is maintained by the n buffer layer 23 formed between the $p^+$ drain layer 22 and the $n^-$ high resistance layer 21, the element must be very thin. However, this type of IGBT is disadvantageous in that the lapping error is large and the element characteristic is varied considerably. Therefore, there is a demand for a semiconductor device which has an element having required turn-off time and ON characteristic using a thin substrate and which can suppress the influence of the lapping error on the element characteristic.

BRIEF SUMMARY OF THE INVENTION

According to an aspect of the present invention, there is provided a semiconductor device comprising:

a first buffer layer of a first conductivity type; a high resistance layer of the first conductivity type formed on the first buffer layer; a base layer of a second conductivity type formed on the high resistance layer; a source region of the first conductivity type in a surface region of the base layer; a gate electrode insulated from the source region, the base layer and the high resistance layer; a drain layer of the second conductivity type formed on an opposite side of the first buffer layer from a surface on which the high resistance layer is formed; and a second buffer layer of the first conductivity type formed between the first buffer layer and the drain layer, an impurity concentration of the second buffer layer being higher than that of the first buffer layer.

According to another aspect of the present invention, there is provided a method for manufacturing a semiconductor device comprising: forming a high resistance layer of a first conductivity type on a main surface of a first buffer layer of the first conductivity type, an impurity concentration of the high resistance layer being lower than that of the first buffer layer; forming a base layer of a second conductivity type in a surface region of the high resistance layer;

forming a source region of the first conductivity type in a surface region of the base layer; forming a gate electrode insulated from the source region, the base layer and the high resistance layer; lapping a rear surface of the first buffer layer; injecting impurities through the rear surface of the first buffer layer, thereby forming a second buffer layer of the first conductivity type, an impurity concentration of the second buffer layer being higher than that of the first buffer layer; and forming a drain layer of the second conductivity type on a rear surface of the second buffer layer.

BRIEF DESCRIPTION OF THE SEVERAL VIEWS OF THE DRAWING

FIGS. 11A to 11D are cross-sectional views showing steps subsequent to the step shown in FIG. 10D;

DETAILED DESCRIPTION OF THE INVENTION

Embodiments of the present invention will now be described with reference to the accompanying drawings.

(First Embodiment)

Figure 1:
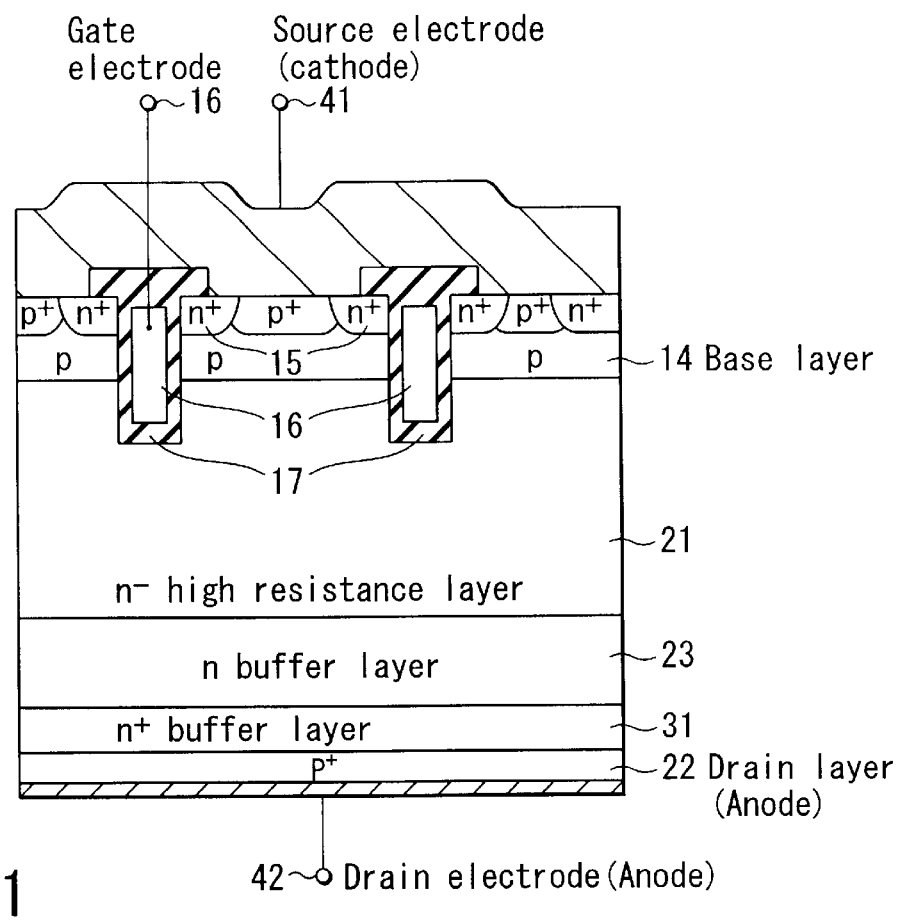
FIG. 1 is a cross-sectional view of a semiconductor device according to a first embodiment of the present invention.
Figure 18A:
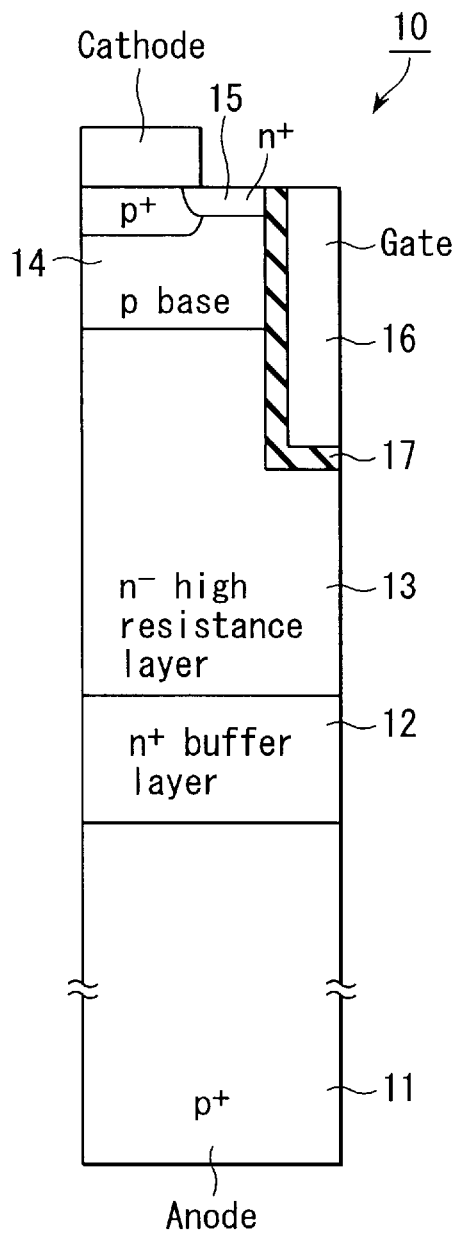
FIGS. 18A and 18B are cross-sectional views showing conventional semiconductor devices.
Figure 18B:
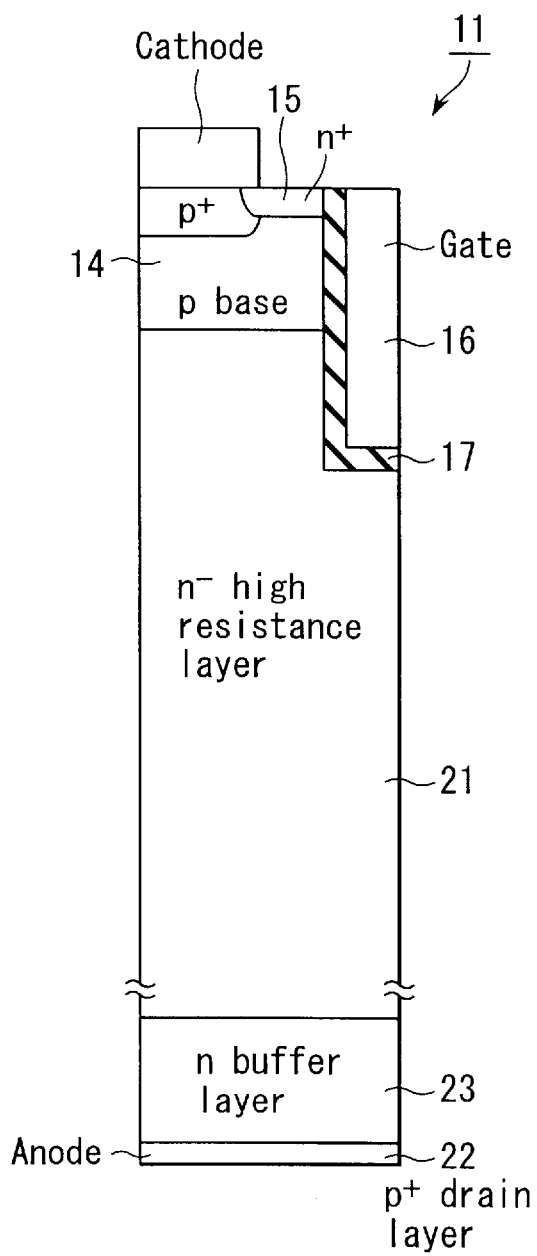

FIG. 1 is a cross sectional view of a vertical IGBT, which uses a thin layer substrate, according to a first embodiment of the present invention. In FIG. 1, the same parts as those shown in FIGS. 18A and 18B are identified by the same reference numerals as those used in FIGS. 18A and 18B.

As shown in FIG. 1, the IGBT of the first embodiment has a $p^+$ drain layer (anode) 22 injected with a small amount of impurities, which is employed in a non-punch-through element. It also comprises an $n^+$ buffer layer 31 formed between the $p^+$ drain layer 22 and an n buffer layer 23. The impurity concentration of the $n^+$ buffer layer 31 is higher than that of the n buffer layer 23.

The n buffer layer 23 has an impurity concentration as low as, for example, about $3 \times 10^{14}$ cm$^{-3}$ and a thickness of, for example, 30 μm. The $p^+$ drain layer 22 has a surface concentration of about $3 \times 10^{18}$ cm$^{-3}$ with a low concentration and a thickness of, for example, 0.3 μm. In this case, the total amount of the impurity in the drain layer 22 is $9 \times 10^{13}$ cm$^{-2}$. In general, it is preferable that the total amount of the impurity in the drain layer 22 be $1 \times 10^{15}$ cm$^{-2}$ or less.

The $n^+$ buffer layer 31 has an impurity concentration of, for example, $1 \times 10^{18}$ cm$^{-3}$ and a thickness of, for example, 0.5 μm or more and 3 μm or less, preferably, for example, 1.5 μm.

A source electrode 41 is connected to the base layer and a source region. A drain electrode 42 is connected to the $p^+$ drain layer 22.

The above IGBT adopts the $p^+$ drain layer 22 injected with a small amount of impurities. Therefore, the efficiency of injecting carriers from the anode can be reduced, with the result that the switching speed can be increased without controlling the lifetime.

In addition, the carrier density of the $n^-$ high resistance layer 21 can be increased without controlling the lifetime. Therefore, the voltage drop in the ON time can be about 1.2 V, which is much lower as compared to that in the conventional IGBT.

Thus, the structure of the first embodiment can improve the trade-off relationship between the increase in switching speed and the decrease in ON voltage.

Figure 2:
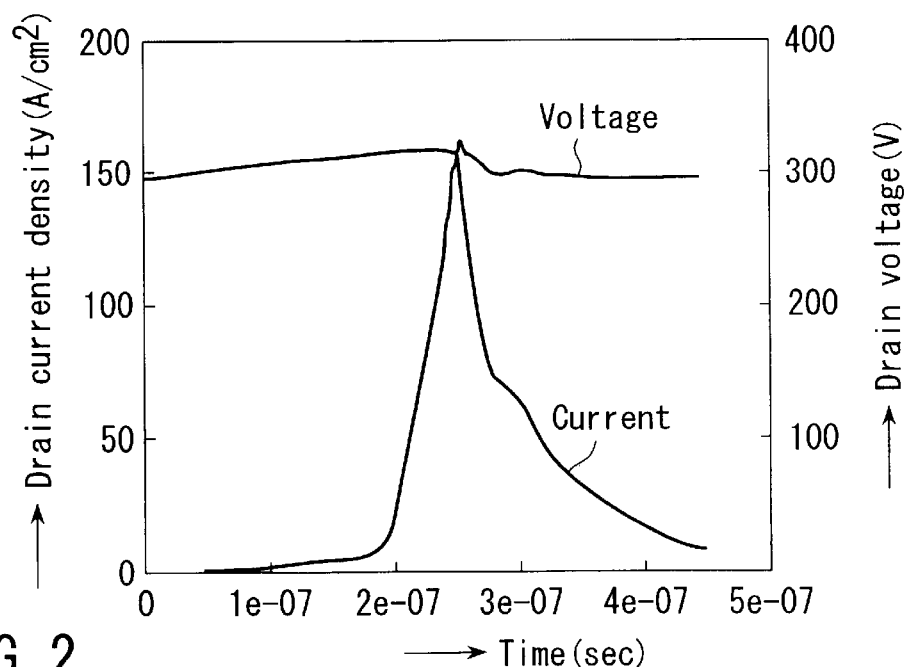
FIG. 2 is a diagram showing a turn-off characteristic of the semiconductor device shown in FIG. 1.

Further, since the $n^+$ buffer layer 23 of a low impurity concentration is present under the $n^-$ high resistance layer 21, the depletion layer extending from the base layer 14 is not immediately stopped during a turn-off period. Therefore, as shown in FIG. 2, the drain current density is reduced gradually in the turn-off period. Consequently, oscillation of the drain current or the drain voltage is prevented.

If only the n buffer layer 23 is used, the static breakdown voltage cannot be maintained, when a high reverse bias is applied. In general, therefore, the thickness of the n buffer layer 23 is increased to maintain the static breakdown voltage. However, according to this method, since the substrate as a whole is thickened, the on-state voltage is inevitably increased.

To avoid this, in the first embodiment, the $n^+$ buffer layer 31 and the n buffer layer 23 formed thereon are used in combination. With this structure, even if a reverse bias is applied, the static breakdown voltage can be sufficiently maintained. It is necessary to set the concentration of the n buffer layer 23 such that the depletion layer is gradually formed in accordance with the applied voltage. In other words, the concentration must be set such that the depletion layer extends in the n buffer layer 23 to maintain the static breakdown voltage of the element, but does not reach the $n^+$ buffer layer 31 of a high concentration to avoid oscillation in the turn-off time.

Specifically, the impurity concentration of the n buffer layer 23 falls in a range, preferably, for example, from $2\times10^{14}$ cm$^{-3}$ to $2\times10^{15}$ cm$^{-3}$, particularly preferably, for example, from $3\times10^{14}$ cm$^{-3}$ to $1\times10^{15}$ cm$^{-3}$. The n$^+$ buffer layer 31 must have such a high concentration as to maintain the static breakdown voltage. To ease the process, it is assumed that the n$^+$ buffer layer 31 is formed by impurity ion injection and a heating step. In this case, the impurity concentration of the n$^+$ buffer layer 31 falls in a range, preferably, for example, from $1\times10^{16}$ cm$^{-3}$ to $1\times10^{19}$ cm$^{-3}$, particularly preferably, for example, from $1\times10^{17}$ cm$^{-3}$ to $5\times10^{18}$ cm$^{-3}$.

Figure 3:
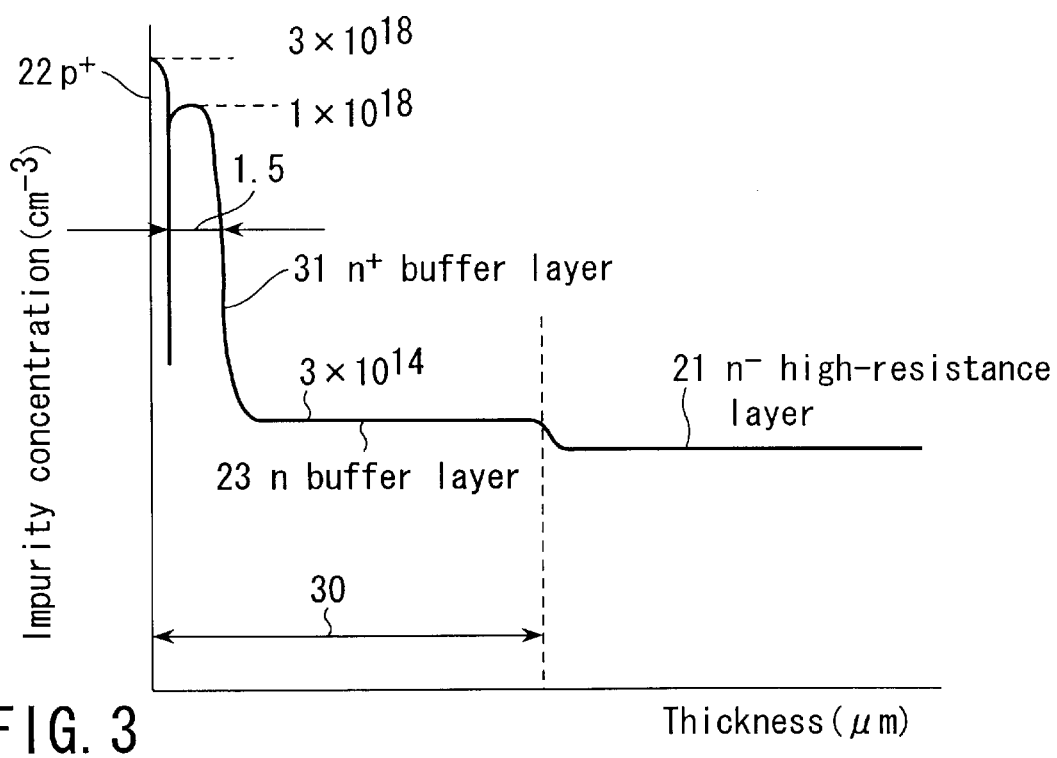
FIG. 3 is a diagram showing an impurity concentration profile of the semiconductor device shown in FIG. 1.

FIG. 3 shows an impurity concentration profile, representing a case where the n buffer layer 23 having an impurity concentration of $3\times10^{14}$ cm$^{-3}$ and a thickness of 30 µm and the n$^+$ buffer layer 31 having an impurity concentration of $1\times10^{18}$ cm$^{-3}$ are used in combination.

Figure 4:
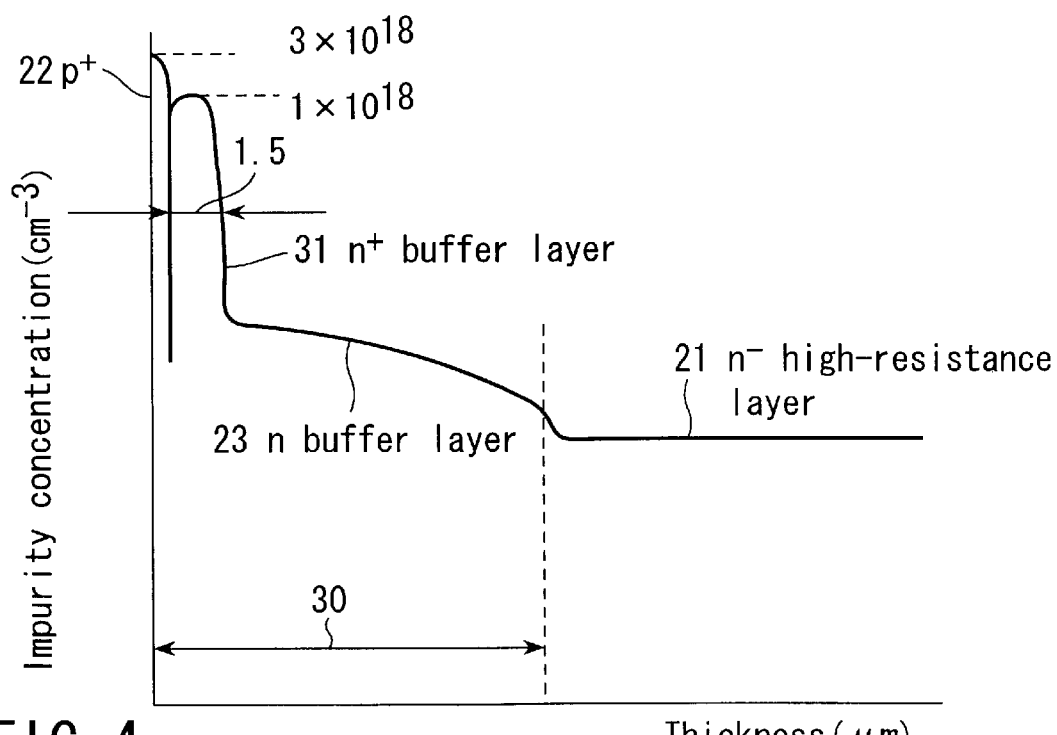
FIG. 4 is a diagram showing an impurity concentration profile of the semiconductor device shown in FIG. 1, in a case where an OSL (One Side Lap) wafer is used.

FIG. 4 shows an impurity concentration profile, representing a case where the n buffer layer 23 is formed by using an OSL (One Side Lap) wafer.

A method for manufacturing the IGBT with the above structure will be described. In the following description, the same parts as those shown in FIG. 1 are identified by the same reference numerals as those used in FIG. 1. The p$^+$ type contact region adjacent to the source region 15 in FIG. 1 is omitted from the description.

(First Manufacturing Method)

FIGS. 5A to 5C and 6 show a case in which a wafer including an n buffer layer 23 formed in advance by epitaxial growth is used.

Figure 5A:
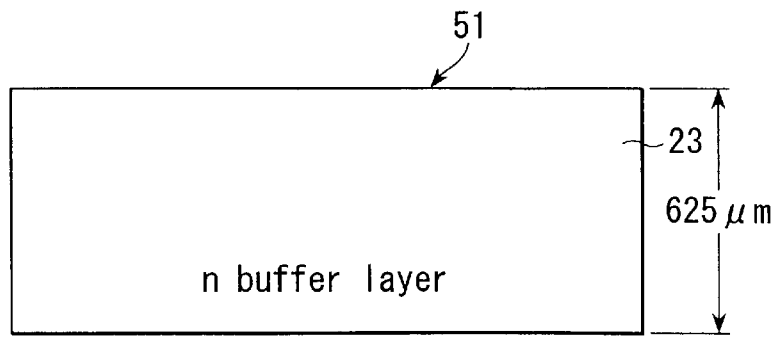
FIGS. 5A to 5C are cross-sectionals views showing a first method for manufacturing a semiconductor device of the present invention.

As shown in FIG. 5A, a wafer 51 includes an n buffer layer 23 formed in advance by epitaxial growth. The n buffer layer 23 is, for example, 625 µm thick.

Figure 5B:
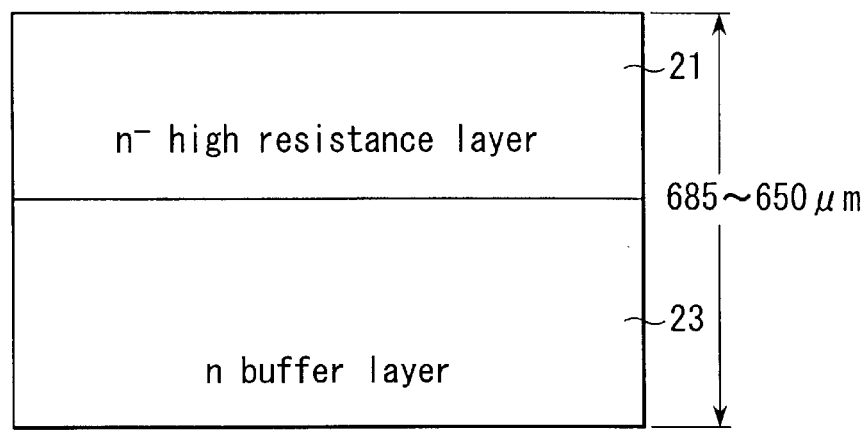

First, as shown in FIG. 5B, an n$^-$ high resistance layer 21, having a thickness of, for example, 25 to 60 µm, is formed by epitaxial growth on the n buffer layer 23. Accordingly, the total thickness of the n buffer layer 23 and the n$^-$ high resistance layer 21 is about 685 to 650 µm.

Figure 5C:
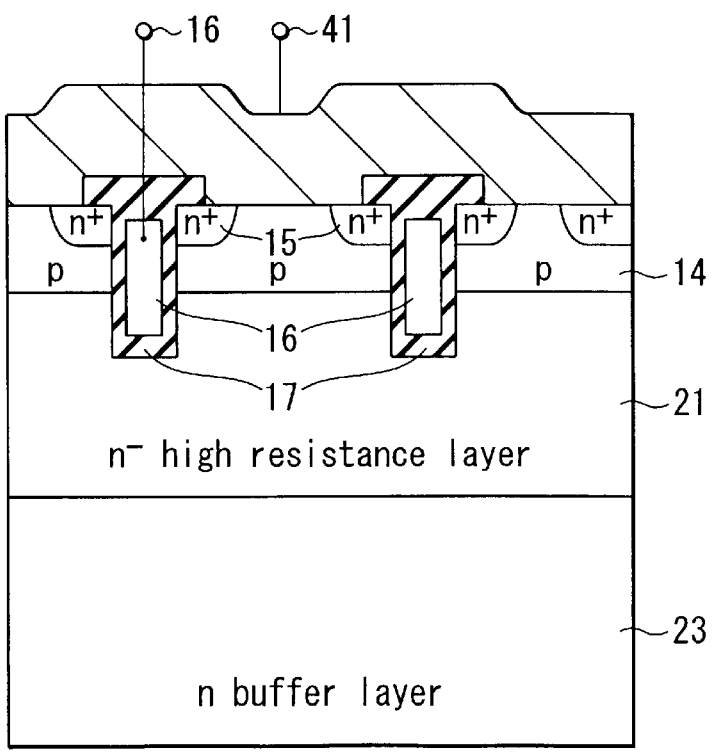

Thereafter, as shown in FIG. 5C, a p base layer 14, an n$^+$ source region 15, a trench-type gate electrode 16, a gate insulating film 17 and a source electrode 41 are sequentially formed by a known process.

Figure 6:
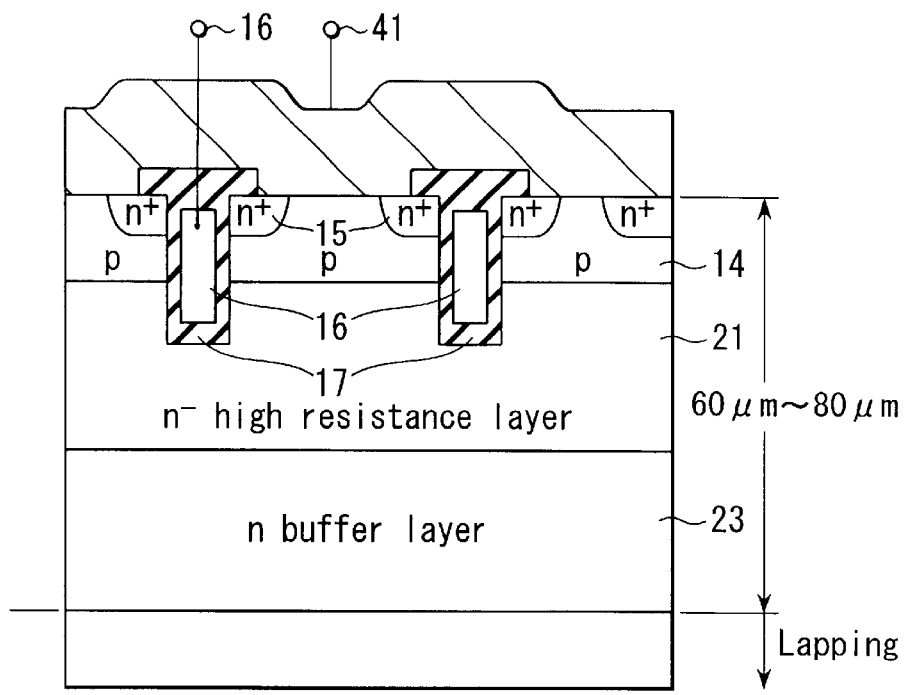
FIG. 6 is a cross-sectional view showing a step subsequent to the step shown in FIG. 5C.

Then, as shown in FIG. 6, the rear surface of the buffer layer 23 is lapped. In the case of the IGBT of the static breakdown voltage of 600V, the total thickness from the main surface of the base layer 14 to the rear surface of the n buffer layer 23 is, for example, 60 to 80 µm.

Thereafter, phosphorus and boron are sequentially ion-injected through the rear surface of the n buffer layer 23. Then, a heat treatment, such as laser annealing, flash annealing, sintering or diffusion, is performed, thereby forming an n$^+$ buffer layer 31 and a p$^+$ drain layer 22. Subsequently, a drain electrode 42 is formed. As a result, the IGBT shown in FIG. 1 is completed.

The source electrode 41 may be formed after the n$^+$ buffer layer and the drain layer 22 are formed.

(Second Manufacturing Method)

Figures 7A, 7B, 7C:
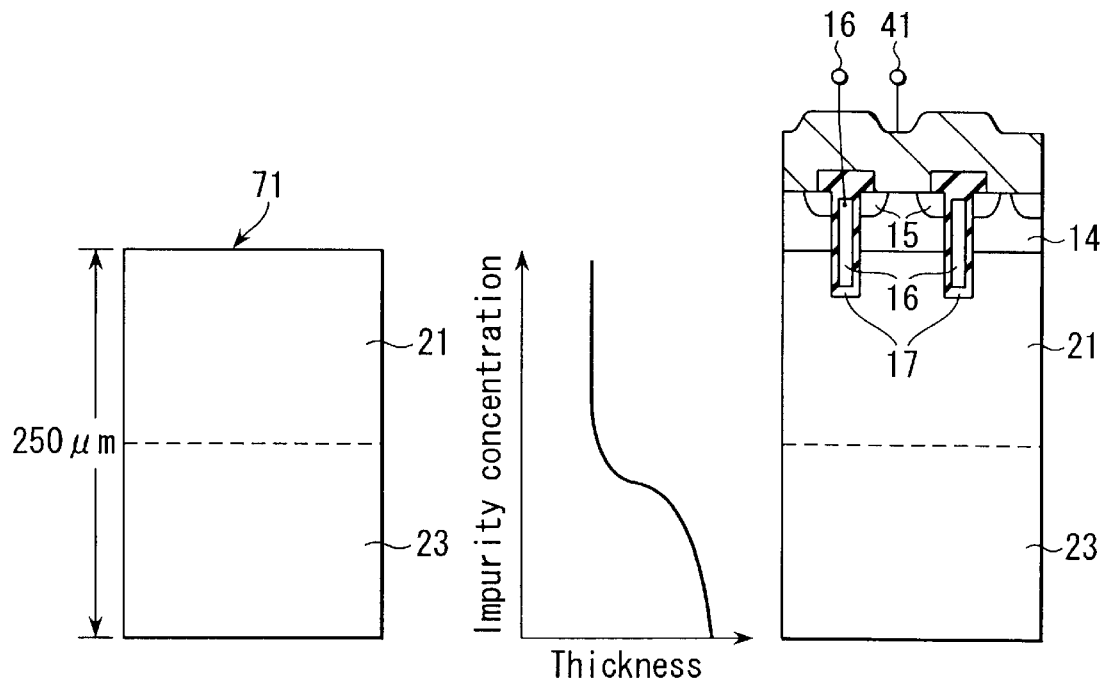
FIGS. 7A to 7C are cross-sectionals views showing a second method for manufacturing a semiconductor device of the present invention.

FIGS. 7A to 7C show a case in which an OSL wafer including an n buffer layer 23 is used. In the second manufacturing method, the step of forming a MOS transistor and the step of forming an n$^+$ buffer layer 31 and a drain layer 22 are the same as those in the first manufacturing method.

As shown in FIG. 7A, an OSL wafer 71 includes an n buffer layer 23 and an n$^-$ high resistance layer 21. The surface of the n$^-$ high resistance layer 21 is lapped in advance so that the wafer has a thickness of, for example, 250 µm.

FIG. 7B shows the relationship between the impurity concentration and the thickness in the buffer layer 23 and the n$^-$ high resistance layer 21. These layers have the concentrations as mentioned above.

As shown in FIG. 7C, a p base layer 14, an n source region 15, a trench-type gate electrode 16, a gate insulating film 17 and a source electrode 41 are sequentially formed by the known process as in the first manufacturing method. Then, the rear surface of the n buffer layer 23 is lapped such that the total thickness is, for example, 60 to 80 µm. Thereafter, an n$^+$ buffer layer 31 and a drain layer 22 are formed in the same manner as in the first manufacturing method.

The effect of the second manufacturing method is the same as that of the first manufacturing method.

A manufacturing method for stabilizing the film thickness after lapping will next be described.

(Third Manufacturing Method)

FIGS. 8A to 8D and 9A to 9D show a third manufacturing method according to the present invention, in which an IGBT having a drain layer doped at a low dose is used. With this method, the thickness after lapping can be controlled with high accuracy.

Figure 8A:
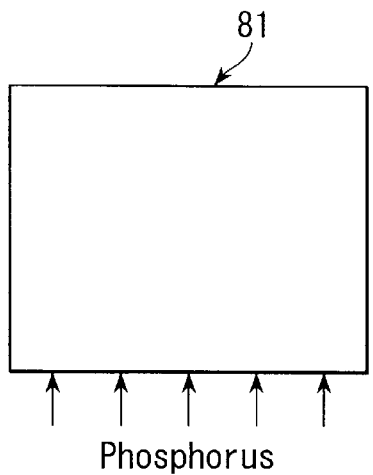
FIGS. 8A to 8D are cross-sectionals views showing a third method for manufacturing a semiconductor device of the present invention.
Figure 8B:
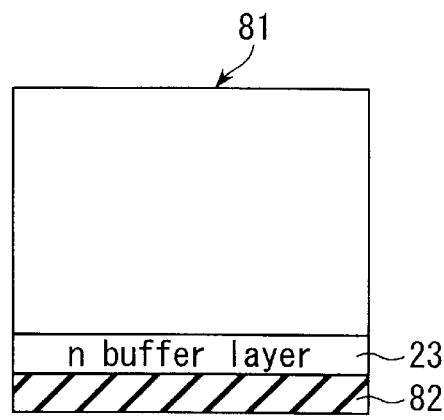

Referring to FIG. 8A, a wafer 81 is made of n-type silicon. To form an n buffer layer 32, for example, phosphorus is ion-injected into one surface of the wafer 81. Then, a heat treatment is performed, thereby forming the n buffer layer 23, as shown in FIG. 8B. Subsequently, an oxide film 82 is formed on the one surface of the wafer 81.

Figure 8C:
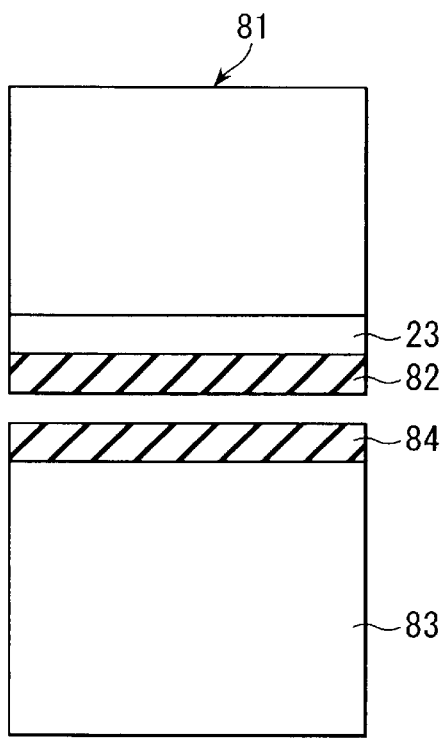
Figure 8D:
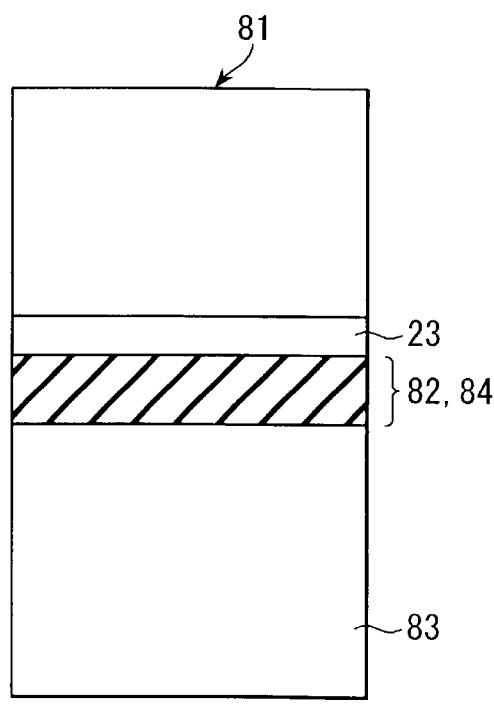

Then, as shown in FIGS. 8C and 8D, the wafer 81 is caused to adhere to a supporting substrate 83. The supporting surface 83, as well as the wafer 81, is an n-type silicon wafer. It has an oxide film 84 in one surface portion. The oxide film 82 of the wafer 81 and the oxide film 84 of the supporting substrate 83 are faced each other, and joined together by van der Waals force. These oxide films 82 and 84 may have any thickness. Oxide films need not be formed on both the wafer 81 and the supporting substrate 82, but may be formed on only one of them. Thus, the substrate of a SOI structure is formed.

Figure 9A:
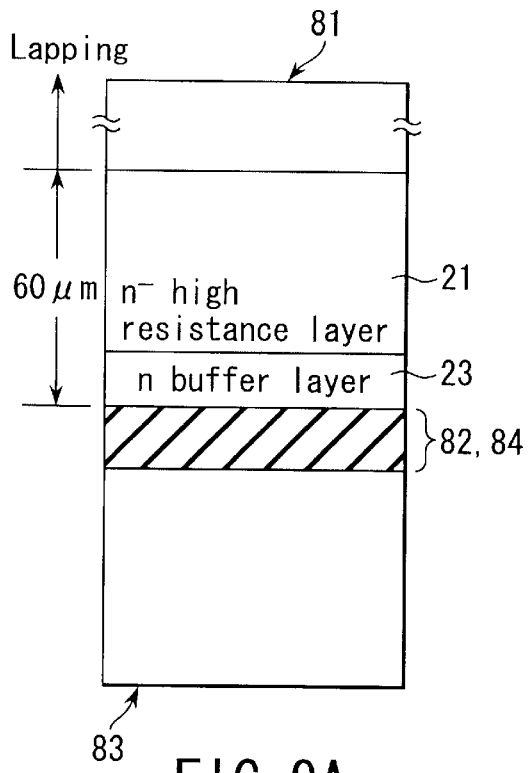
FIGS. 9A to 9D are cross-sectional views showing steps subsequent to the step shown in FIG. 8D.

Thereafter, as shown in FIG. 9A, the other surface of the wafer 81 is lapped. For example, in the case of an IGBT of the 600V voltage series, the wafer 81 is lapped to a thickness of about, for example, 60 µm. Thus, the n$^-$ high resistance layer 21 is formed on the n buffer layer 23.

Figure 9B:
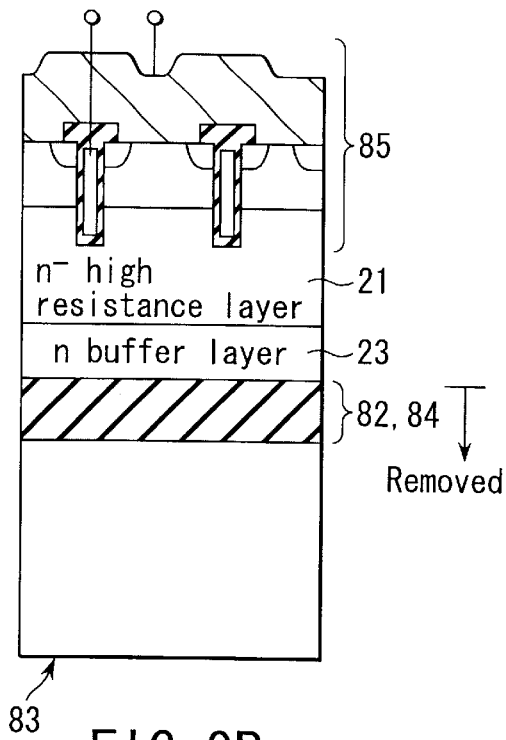

Then, as shown in FIG. 9B, a trench-type IGBT MOS gate structure 85 is formed in the n$^-$ high resistance layer 21 through the same process as in the first and second methods.

Figure 9C:
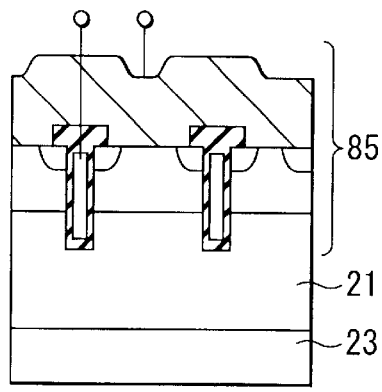

Subsequently, as shown in FIG. 9C, the supporting substrate 83 is lapped and removed. Then, the oxide films 82 and 84 are removed by, for example, CDE (Chemical Dry Etching). The oxide films 82 and 84 and the silicon wafer can be selectively etched. Therefore, the etching of the oxide films 82 and 84 is stopped at the interface between the n buffer layer 23 and the oxide films 82 and 84. Thus, the thickness of the wafer 81 can be maintained after the etching. In other words, the lapping error that was inevitable in the conventional device can be eliminated by etching the supporting substrate 83 in the above SOI structure.

Figure 9D:
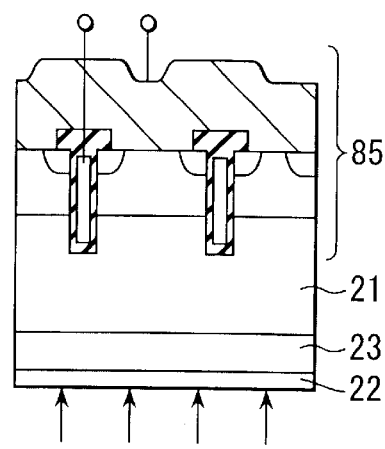

Thereafter, as shown in FIG. 9D, the anode side is processed. More specifically, for example, boron is ion-injected to a surface region of the n buffer layer 23. Then, a heat treatment, such as laser annealing, flash annealing, sintering or diffusion, is performed, thereby forming a p⁺ drain layer 22. Finally, a drain electrode is formed, with the result that the IGBT is completed.

With the third manufacturing method, the SOI structure comprised of the wafer 81 and the supporting substrate 83 is used. The wafer 81 is lapped and the MOS gate structure 85 is formed, and thereafter the supporting substrate 83 is removed. Further, the oxide films 82 and 84 are removed by selective etching. Thus, since the total thickness of the IGBT is not changed after the MOS gate structure 85 is formed, the third method is advantageous in that the IGBT having designed characteristics can be manufactured.

(Fourth Manufacturing Method)

FIGS. 10A to 10D and 11A to 11D show a fourth manufacturing method according to the present invention. The same parts as those in the third method are identified by the same reference numerals as those used in the description of the third method. The fourth manufacturing method is different from the third manufacturing method in the following respect: an n buffer layer and a p⁺ drain layer are formed after the substrate is thinned.

Figure 10A:
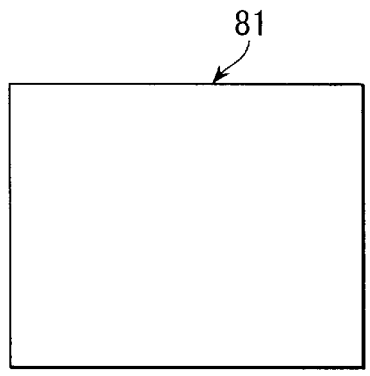
FIGS. 10A to 10D are cross-sectional views showing a fourth method for manufacturing a semiconductor device of the present invention.
Figure 10B:
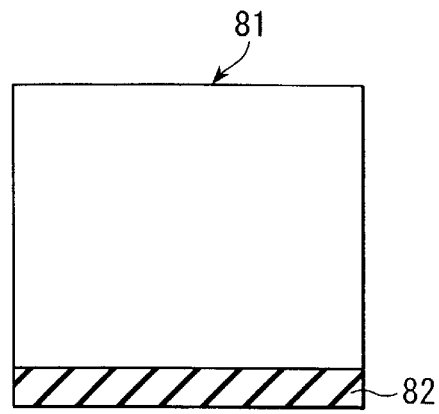

As shown in FIGS. 10A and 10B, an oxide film 82 is formed on one surface of a wafer 81 made of n-type silicon.

Figure 10C:
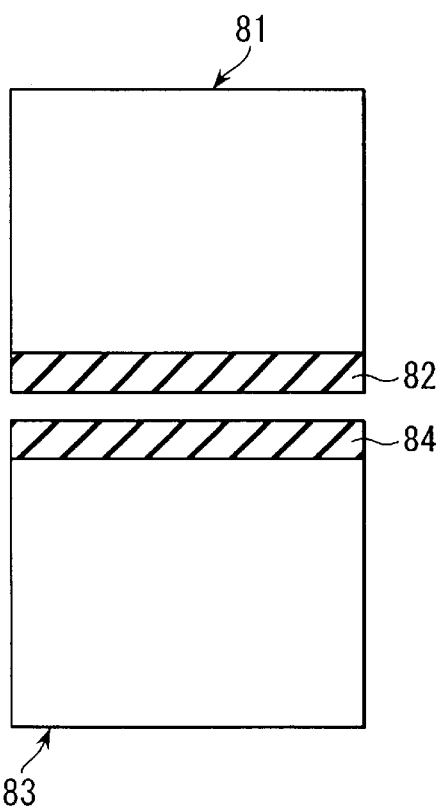
Figure 10D:
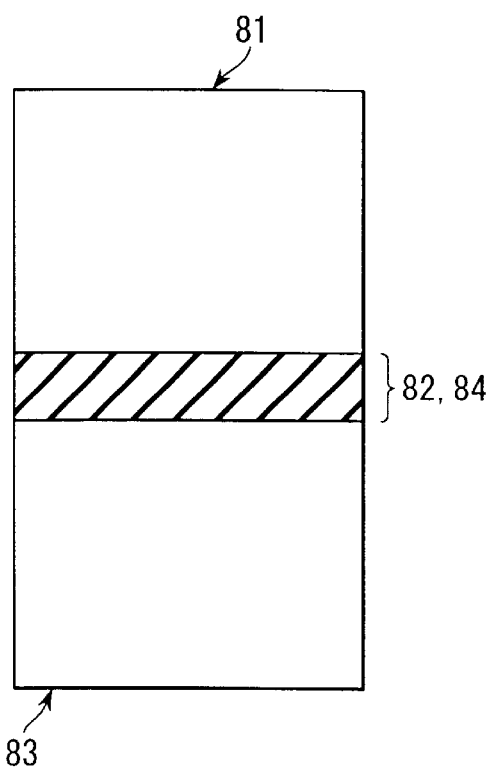

Then, as shown in FIGS. 10C and 10D, the wafer 81 is caused to adhere to a supporting substrate 83. The supporting surface 83, as well as the wafer 81, is an n-type silicon wafer. It has an oxide film 84 in one surface portion. The oxide film 82 of the wafer 81 and the oxide film 84 of the supporting substrate 83 are faced each other, and joined together by van der Waals force. These oxide films 82 and 84 may have any thickness. Oxide films need not be formed on both the wafer 81 and the supporting substrate 82, but may be formed on only one of them. Thus, the substrate of a SOI structure is formed.

Thereafter, as shown in FIG. 11A, the other surface of the wafer 81 is lapped. For example, in the case of an IGBT of the 600V voltage series, the wafer 81 is lapped to a thickness of about, for example, 60 μm. Thus, an n⁻ high resistance layer 21 is formed.

Then, as shown in FIG. 11B, a trench-type IGBT MOS gate structure 85 is formed in the n⁻ high resistance layer 21 of the wafer 81 through the same process as in the first to third methods.

Subsequently, as shown in FIG. 11C, the supporting substrate 83 is lapped and removed. The oxide films 82 and 84 are removed by, for example, CDE. The etching is stopped at the interface between the n⁻ high resistance layer 21 and the oxide films 82 and 84. Thus, the thickness of the wafer 81 can be maintained after the etching. Thereafter, the anode side is processed. More specifically, for example, phosphorus is ion-injected to the rear surface of the n⁻ high resistance layer 21, thereby forming an n buffer layer 23.

Then, as shown in FIG. 11D, for example, boron is ion-injected to a surface region of the n buffer layer 23. Then, a heat treatment, such as laser annealing, flash annealing, sintering or diffusion, is performed, thereby forming a p⁺ drain layer 22. Finally, a drain electrode is formed, with the result that the IGBT is completed.

The effect of the fourth manufacturing method is the same as that of the third manufacturing method. Moreover, since the p⁺ drain layer 22 is formed in a close-to-final step, the fourth method has advantages that the influence of the heat treatment is less and variation in dose or thickness can be prevented.

(Fifth Manufacturing Method)

FIGS. 12A to 12D and 13A and 13B show a fifth manufacturing method according to the present invention. The same parts as those in the third method are identified by the same reference numerals as those used in the description of the third method. The fifth manufacturing method is different from the fourth manufacturing method in the following respect: impurity ions are injected into a wafer 81 to form an n buffer layer 23 and a p⁺ drain layer 22 before a SOI structure is formed.

Figure 12A:
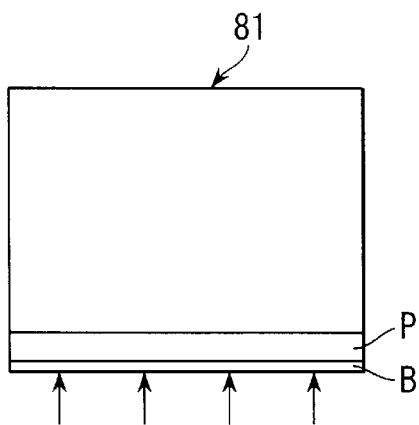
FIGS. 12A to 12D are cross-sectionals views showing a fifth method for manufacturing a semiconductor device of the present invention.
Figure 12B:
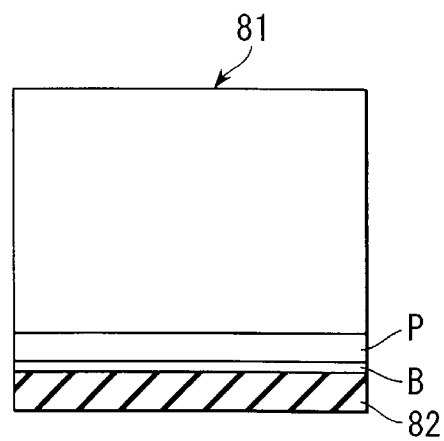

As shown in FIG. 12A, for example, phosphorus (P) to form an n buffer layer 23 is ion-injected into one surface of an n-type silicon wafer 81. Further, boron (B) to form a p⁺ drain layer 22 is ion-injected to the wafer 81. Thereafter, an oxide film 82 is formed on the one surface of the wafer 81, as shown in FIG. 12B.

Figure 12C:
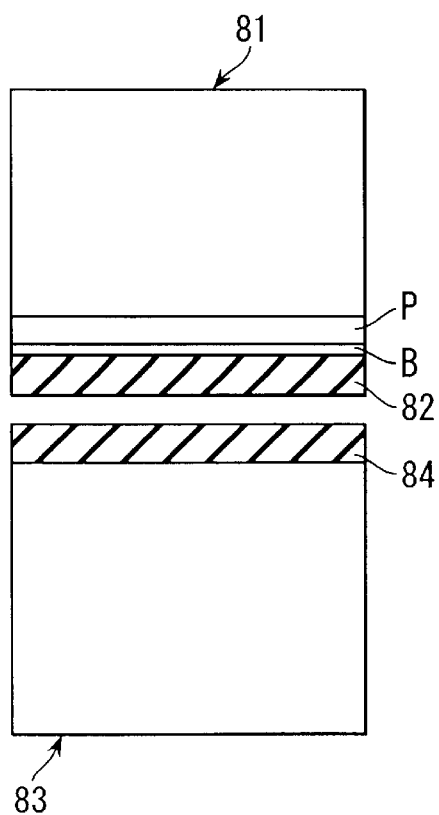
Figure 12D:
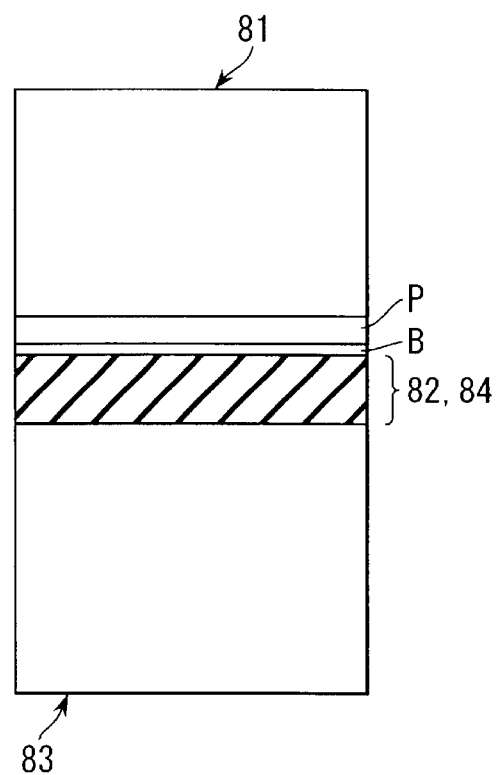

Then, as shown in FIGS. 12C and 12D, the wafer 81 is caused to adhere to a supporting substrate 83. The supporting surface 83, as well as the wafer 81, is an n-type silicon wafer. It has an oxide film 84 in one surface portion. The oxide film 82 of the wafer 81 and the oxide film 84 of the supporting substrate 83 are faced each other, and joined together by van der Waals force. These oxide films 82 and 84 may have any thickness. Oxide films need not be formed on both the wafer 81 and the supporting substrate 82, but may be formed on only one of them. Thus, the substrate of a SOI structure is formed.

Figures 13A, 13B:
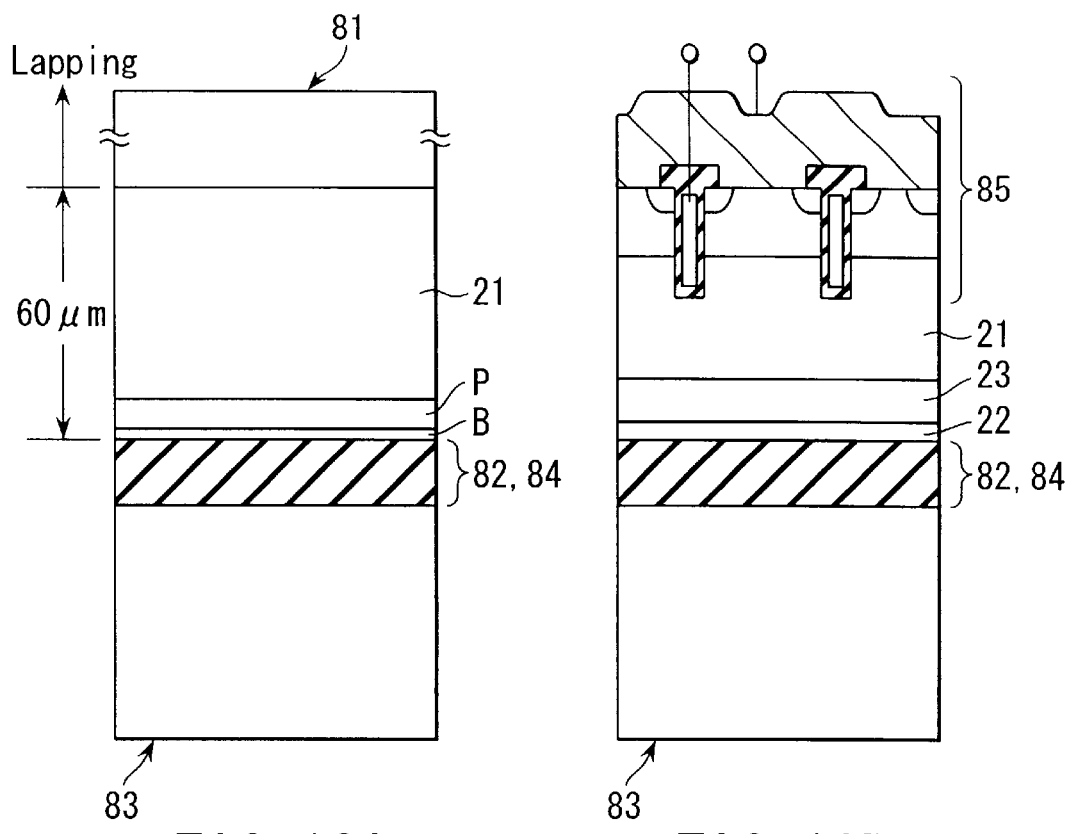
FIGS. 13A to 13C are cross-sectional views showing steps subsequent to the step shown in FIG. 12D.

Thereafter, as shown in FIG. 13A, the other surface of the wafer 81 is lapped, thereby forming an n⁻ high resistance layer 21. For example, in the case of an IGBT of the 600V voltage series, the wafer 81 is lapped to a thickness of about, for example, 60 μm.

Then, as shown in FIG. 13B, a trench-type IGBT MOS gate structure 85 is formed in the n⁻ high resistance layer 21 of the wafer 81 in the same process as in the first to fourth methods. At the same time, the phosphorus and boron ions that have been injected in the wafer 81 are diffused by heat processes. As a result, an n buffer layer 23 and a p⁺ drain layer 22 are formed.

Figure 13C:
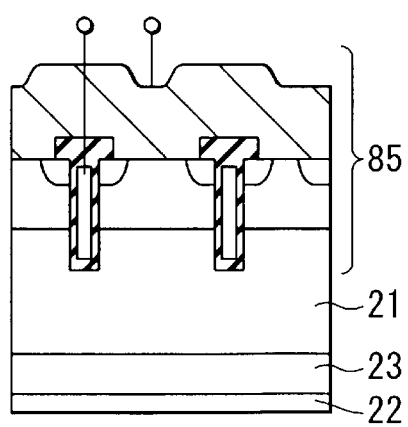

Subsequently, as shown in FIG. 13C, the supporting substrate 83 is lapped and removed. The oxide films 82 and 84 are removed by, for example, CDE. The oxide films 82 and 84 and the silicon wafer can be selectively etched. Therefore, the etching can be stopped at the interface between the n buffer layer 23 and the oxide films 82 and 84. Thus, the thickness of the wafer 81 can be maintained after the etching. In other words, the lapping error that was inevitable in the conventional device can be eliminated by etching the supporting substrate 83 in the above SOI structure.

According to the fifth manufacturing method, the impurity ions to form the n buffer layer 23 and the p⁺ drain layer 22 are injected into the wafer 81 before the SOI structure is formed. Therefore, since the ions are injected successively, the manufacturing process is simplified. In addition, since the ions are injected to the thick wafer, the process can be eased.

(Sixth Manufacturing Method)

FIGS. 14A to 14D and 15A and 15B show a sixth manufacturing method according to the present invention. The same parts as those in the third method are identified by the same reference numerals as those used in the description of the third method. In the third to fifth manufacturing methods, the SOI structure is formed by joining the wafer 81 and the supporting substrate 83. According to the sixth method, the SOI structure is formed by using a substrate of a SIMOX (Separation by IMplanted OXide).

Figure 14A:
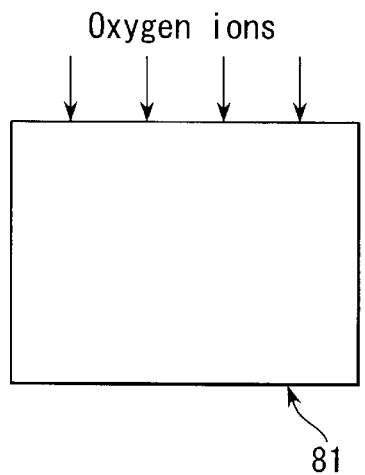
FIGS. 14A to 14D are cross-sectionals views showing a sixth method for manufacturing a semiconductor device of the present invention.
Figure 14B:
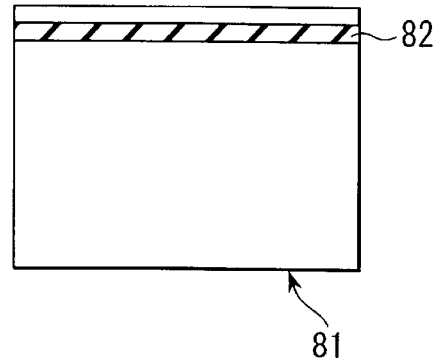

As shown in FIG. 14A, for example, oxygen is ion-injected into one surface of an n-type silicon wafer 81. As a result, an oxide film 82 is formed at a depth of several microns from the surface of the wafer 81, as shown in FIG. 14B.

Figure 14C:
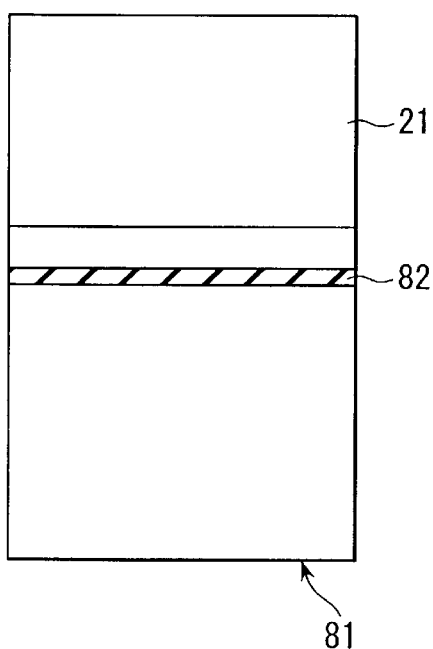

Then, as shown in FIG. 14C, an n⁻ high resistance layer 21 is formed on the surface of the wafer 81 by, for example, epitaxial growth. The epitaxial growth is controlled such that the n⁻ high resistance layer 21 has a thickness of, for example, 60 μm from the oxide film 82. Thus, the substrate of the SOI structure is formed.

Figure 14D:
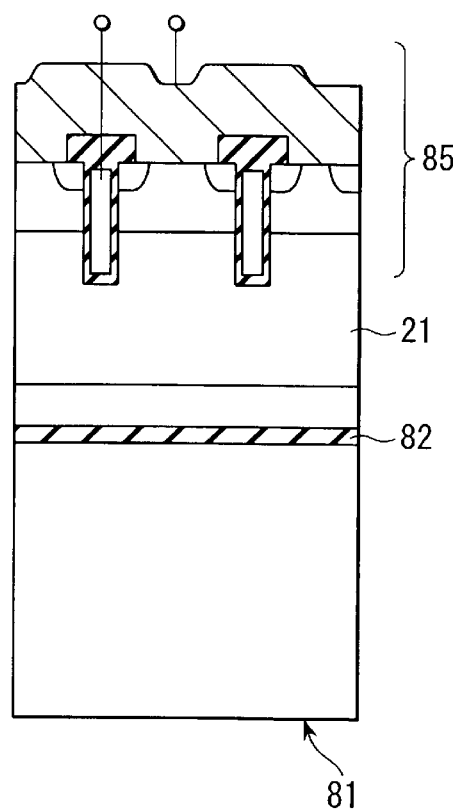

Thereafter, as shown in FIG. 14D, a trench-type IGBT MOS gate structure 85 is formed in the n⁻ high resistance layer 21 of the wafer 81 in the same process as in the first to fifth methods.

Figure 15A:
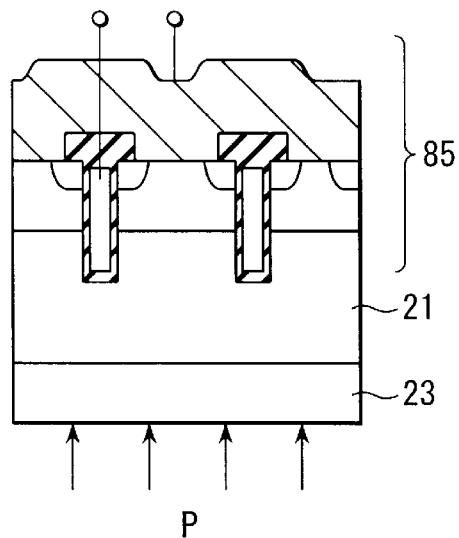
FIGS. 15A and 15B are cross-sectional views showing steps subsequent to the step shown in FIG. 14D.

Subsequently, as shown in FIG. 15A, the rear surface of the wafer 81 is lapped and removed. Then, the oxide film 82 is removed by, for example, CDE. The oxide film 82 and the silicon wafer can be selectively etched. Therefore, the thickness of the wafer 81 on the n⁻ high resistance layer 21 side can be maintained after the etching. In other words, the lapping error that was inevitable in the conventional device can be eliminated by etching the wafer 81 in the above SOI structure.

Figure 15B:
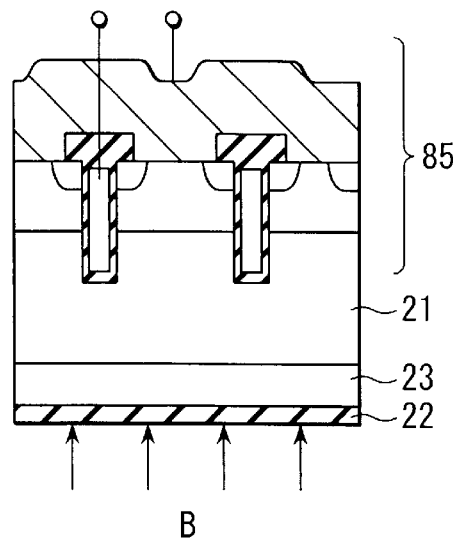

Thereafter, as shown in FIGS. 15A and 15B, phosphorus and boron are sequentially ion-injected through the rear surface of the wafer 81, so that an n buffer layer 23 and a p⁺ drain layer 22 are formed.

According to the sixth manufacturing method, the IGBT is manufactured by using a substrate of the SIMOX structure. Since it is unnecessary to use a supporting substrate, the manufacturing cost can be reduced.

(Seventh Manufacturing Method)

FIGS. 16A, 16B and 17A to 17D show a seventh manufacturing method according to the present invention. The same parts as those in the third method are identified by the same reference numerals as those used in the description of the third method. In the third to fifth manufacturing methods, the SOI structure is formed by joining the supporting substrate 83 and the wafer 81. The seventh method uses a porous silicon instead.

Figure 16A:
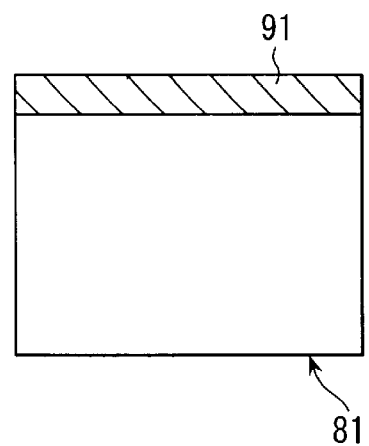
FIGS. 16A and 16B are cross-sectional views showing a seventh method for manufacturing a semiconductor device of the present invention.

As shown in FIG. 16A, for example, a porous silicon layer 91 is formed on one surface of a wafer 81 made of n type silicon, which serves as a supporting substrate.

Figure 16B:
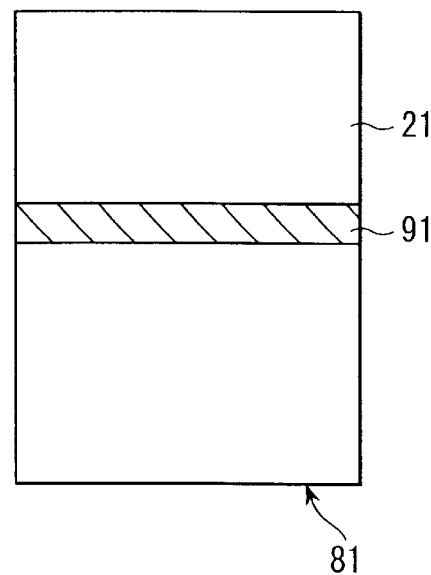

Then, as shown in FIG. 16B, an n⁻ high resistance layer 21 is formed on the surface of the porous silicon layer 91 by, for example, epitaxial growth. The epitaxial growth is controlled such that the n⁻ high resistance layer 21 has a thickness of, for example, 60 μm.

Figure 17A:
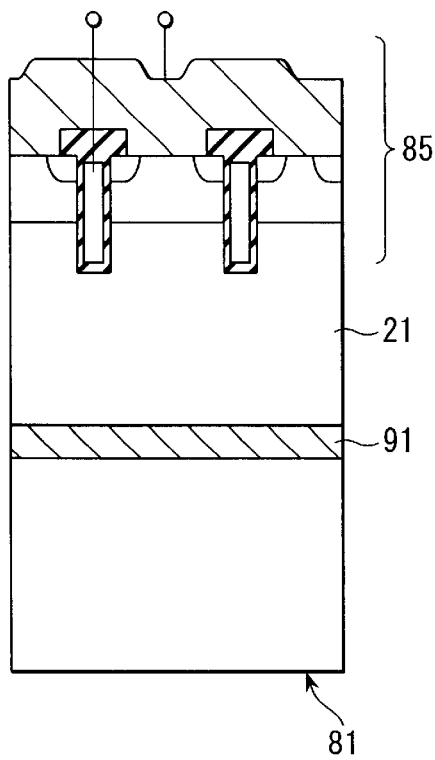
FIGS. 17A to 17D are cross-sectional views showing steps subsequent to the step shown in FIG. 16B.

Thereafter, as shown in FIG. 17A, a trench-type IGBT MOS gate structure 85 is formed in the n⁻ high resistance layer 21 in the same process as in the first to sixth methods.

Figure 17B:
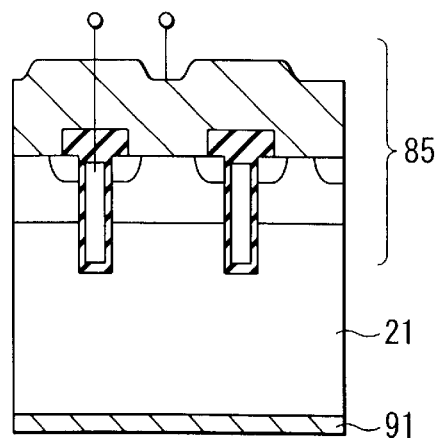

Then, as shown in FIG. 17B, the n⁻ high resistance layer 21 and the wafer 81 are separated from each other at the porous silicon layer 91. Thereafter, the porous silicon layer 91 is removed by, for example, CDE.

Figure 17C:
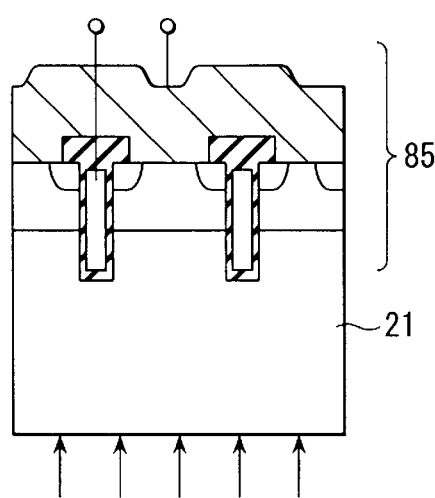
Figure 17D:
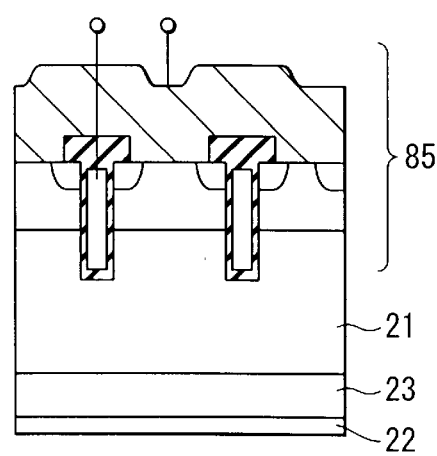

Subsequently, as shown in FIGS. 17C and 17D, phosphorus and boron are sequentially ion-injected through the rear surface of the n⁻ high resistance layer 21, so that an n buffer layer 23 and a p⁺ drain layer 22 are formed.

According to the seventh manufacturing method, the porous silicon layer 91 is formed on the wafer 81. After the MOS gate structure 85 is formed in the n⁻ high resistance layer 21 on the porous silicon layer 91, the wafer 81 is separated from the n⁻ high resistance layer 21 at the porous silicon layer 91. Thus, since no lapping process is required, the seventh method has an advantage that the thickness of the n⁻ high resistance layer 21 does not vary.

In addition, the wafer 81 serving as a supporting substrate can be reused after being separated from the n⁻ high resistance layer 21 at the porous silicon layer 91. Therefore, the manufacturing cost can be reduced.

In the third to seventh manufacturing methods, an n⁺ buffer 31 may be formed between the n buffer layer 23 and the p⁺ drain layer 22 as in the embodiment shown in FIG. 1.

In the third to sixth manufacturing methods, the oxide films 82 and 84 are used to form a SOI structure. However, it is possible to use any other material for the same purpose so far as that can be selectively etched from silicon.

The above descriptions of the embodiments refer to a trench-type IGBT as an example. However, the present invention is not limited to this type. The present invention can be applied to a planar-type IGBT.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first buffer layer of a first conductivity type;
a high resistance layer of the first conductivity type formed on the first buffer layer;
a base layer of a second conductivity type formed on the high resistance layer;
a source region of the first conductivity type in a surface region of the base layer;
a gate electrode insulated from the source region, the base layer and the high resistance layer;
a drain layer of the second conductivity type formed on an opposite side of the first buffer layer from a surface on which the high resistance layer is formed; and
a second buffer layer of the first conductivity type formed between the first buffer layer and the drain layer, an impurity concentration of the second buffer layer being higher than that of the first buffer layer,
whereby a thickness of the drain layer is thinner than that of the second buffer layer, and the drain layer is a low impurity injection layer.

2. The device according to claim 1, wherein the second buffer layer is at least 0.5 μm and at most 3 μm thick.

3. The device according to claim 1, wherein the impurity concentration of the second buffer layer is $1 \times 10^{16}$ cm⁻³ to $1 \times 10^{19}$ cm⁻³ at a maximum.

4. The device according to claim 1, wherein a total amount of impurities contained in the drain layer is at most $1 \times 10^{15}$ cm⁻².

5. The device according to claim 1, wherein the drain layer is approximately 0.3 μm thick.

6. The device according to claim 1, wherein an impurity concentration of a surface of the drain layer is approximately $3 \times 10^{18}$ cm⁻³.

7. The device according to claim 1, wherein the first buffer layer is approximately 30 μm thick.

8. The device according to claim 1, wherein an impurity concentration of the first buffer layer is approximately $2 \times 10^{14}$ cm⁻³ to $2 \times 10^{15}$ cm⁻³.

9. The device according to claim 1, wherein the second buffer layer is at least 0.5 μm and at most 3 μm thick.

10. The device according to claim 1, wherein an impurity concentration of the second buffer layer is approximately $1 \times 10^{16}$ cm⁻³ to $1 \times 10^{19}$ cm⁻³.

* * * * *